United States Patent [19]

Steglich

[11] Patent Number: 5,663,671
[45] Date of Patent: Sep. 2, 1997

[54] ELECTRONIC CIRCUIT INCLUDING OPERATIONAL AMPLIFIER AND CLAMPING CIRCUIT

[75] Inventor: Helmar R. Steglich, Marblehead, Mass.

[73] Assignee: Ametek Aerospace Products, Inc., Wilmington, Mass.

[21] Appl. No.: 595,564

[22] Filed: Feb. 1, 1996

[51] Int. Cl.$^6$ .................................................. H03K 5/08
[52] U.S. Cl. .......................... 327/323; 327/325; 327/379; 327/561
[58] Field of Search .............................. 327/309, 312, 327/314, 316, 323, 325, 379, 560, 561, 562, 563; 330/254, 260, 278

[56] References Cited

U.S. PATENT DOCUMENTS 3,943,467  3/1976  Yamada et al. ................ 327/325
4,578,576  3/1986  Wheeler et al. ................ 250/214

*Primary Examiner*—Terry Cunningham
*Assistant Examiner*—Jeffrey Zweizig
*Attorney, Agent, or Firm*—Hayes, Soloway, Hennessey, Grossman & Hage, P.C.

[57] ABSTRACT

An electronic clamping circuit is provided in one preferred embodiment, the clamping circuit includes a pair of series-connected diodes, both having the same bias, which are shunted across a feedback path of a transimpedance amplifier circuit. A capacitive element is connected to a node in-between the diodes and a potential (e.g., ground). The arrangement of the diodes and capacitive element serve to keep the amplifier circuit's operation within its linear limits without severely degrading its bandwidth.

9 Claims, 4 Drawing Sheets

ELECTRONIC CIRCUIT INCLUDING OPERATIONAL AMPLIFIER AND CLAMPING CIRCUIT

BACKGROUND OF THE INVENTION

1. Field of the Invention

The present invention is related to a clamping circuit and an electronic sensor which uses same. Particular utility for the present invention is found in the area of electromagnetic radiation sensing apparatus, although other utilities are contemplated for the present invention, including other types of sensing apparatus. Additionally, the clamping circuit of the present invention may be used in many different types of electronic devices, and thus, although it will be described in connection with use in sensing apparatus, it should not be viewed as being limited solely to use in this one type of apparatus.

2. Brief Description of Related Prior Art

FIG. 1 is a schematic diagram of a conventional electromagnetic radiation sensor 10. Sensor 10 includes an electronic transimpedance amplifier 12 that comprises an operational amplifier 16 having inverting and non-inverting inputs 18, 20, respectively, and output 28. The inverting input 18 of the operational amplifier is connected via a high impedance feedback path 22 to the output 24 of the amplifier 16, and is also conected, in parallel, to an electromagnetic sensitive photodiode 26 whose anode is connected to ground and cathode is connected to node 54. Typically, the photodiode 26 is made from silicon. Feedback path 22 consists of a resistor 30 (typically having a very large resistance value, e.g., on the order of $10^9$ ohms) connected between the output 28 and the inverting input 18 of the amplifier 16 via node 54. The non-inverting input 20 of the amplifier 16 is connected to ground potential.

In normal operation (i.e., when amplifier 16 is unsaturated), photodiode 26 responds to incident electromagnetic radiation within its frequency band of sensitivity (e.g., the optical frequency band) by generating a photocurrent $I_p$ that is related to the strength of said radiation. In response to the photocurrent $I_p$ generated by the photodiode 26, the operational amplifier 16 supplies feedback current $I_f$ through the feedback path 22. In this configuration, operational amplifier 16 is configured to keep the voltage levels of the inverting and non-inverting inputs 18, 20, respectively, equal to each other. Thus, because the non-inverting input of the amplifier 16 is held at ground potential, the operational amplifier 16 will seek to supply appropriate feedback current $I_f$ to negate the photocurrent $I_p$ generated by the photodiode 26 so as to prevent a potential difference from being generated across photodiode 26, and to thereby force the inverting input 18 of the operational amplifier to remain at ground potential. Thus, the feedback current $I_f$ generated by the amplifier 16 is equal in magnitude to the photocurrent $I_p$ generated by the photodiode 26, but opposite in direction thereto.

Thus, in normal operation of sensor 10, the magnitude of the output voltage $V_{out}$ of the operational amplifier 16 is equal to the magnitude of the photocurrent $I_p$ multiplied by the resistance of the resistor 30. Thus, during said normal operation, the magnitude of the output voltage increases in proportion to the magnitude of the photocurrent $I_p$, and therefore, is indicative of the magnitude of electromagnetic radiation incident to diode 26.

Unfortunately, operational amplifier 16 has a limited output voltage range, and typically will saturate when the magnitude of the output voltage of the operational amplifier is at or near the magnitude of the power supply voltage being supplied to the operational amplifier (e.g., 15 V). When the operational amplifier is saturated, the magnitude of output current generated by the operational amplifier remains constant regardless of further increases in photocurrent generated by the photodiode. Thus, once sufficient photocurrent is generated to cause the operational amplifier to saturate, the operational amplifier becomes unable to generate additional feedback current to compensate for any further increases in photocurrent. This can cause the voltage level of the inverting input 18 of the operational amplifier to rise to a level equal to the uncompensated photocurrent multiplied by the impedance of the photodiode 26. Disadvantageously, this can de-stabilize the operation of the operational amplifier.

Also, since the photodiode 26 has an inherent parasitic capacitance, the potential difference generated across the photodiode 26 as a result of the aforesaid phenomena can cause the photodiode to become charged. The charge stored in the photodiode 26 is then discharged when the strength of the incident electromagnetic radiation falls below the level sufficient to cause saturation of the operational amplifier. Disadvantageously, discharge of the charge stored in the photodiode 26 artificially increases the photocurrent supplied by the photodiode above the amount that is truly indicative of the strength of incident electromagnetic radiation. This can cause the output voltage generated by the operational amplifier to not accurately indicate the strength of incident radiation striking the photodiode. Indeed, it has been found that after significant periods of charging, if the incident electromagnetic signal exciting the photodiode 26 is suddenly removed, the aforesaid discharging phenomena may keep the operational amplifier's output voltage at saturation level for as long as several seconds.

One conventional attempt to solve this problem is embodied in sensor 50 of FIG. 2. Sensor 50 includes all of the elements of sensor 10 of FIG. 1, but also includes a clamping diode 52 shunted across the feedback resistor 30 of the feedback path 22 and forward biased in the same direction as the flow of feeback current $I_f$. In operation of sensor 50, when the output voltage of the operational amplifier 16 increases, the impedance of the clamping diode 52 decreases and thereby reduces the total resistance of the parallel combination of the feedback resistor 30 and diode 52. This permits an increased amount of total current to flow from output 28 to node 54 to cancel out photocurrent $I_p$. Using this technique, it is possible to ensure sufficient current flow to node 54 from output 28 to negate any expected magnitude of photocurrent.

Unfortunately, however, the technique illustrated in FIG. 2 has at least one significant drawback. Diode 52 has its own inherent parasitic capacitance (typically at least 10 pF) which parasitic capacitance deleteriously effects the bandwidth and time constant of the sensor 50 of FIG. 2 when compared to the sensor 10 of FIG. 1. Indeed, it has been found that the inclusion of clamping diode 52 in sensor 50 can decrease the bandwidth and increase the time constant of sensor 50 by more than an order of magnitude when compared to the sensor 10 of FIG. 1.

An example of a conventional clamping circuit is described in U.S. Pat. No. 4,578,576 to Wheeler et at. Unfortunately, this patent suffers from the aforesaid and/or other disadvantages and drawbacks of the prior art discussed above.

SUMMARY OF THE INVENTION

Accordingly, the present invention provides a clamping circuit and sensor using same that overcome the aforesaid and other disadvantages and drawbacks of the prior art. One preferred embodiment of the clamping circuit of the present invention essentially comprises a pair of diodes connected together in series and being biased in the same direction. Another diode is shunted across one diode of the pair of diodes and is reversed biased compared to the one diode. A capacitive element connects an anode of the other diode to a ground potential. Preferably, the capacitive element has a capacitance C, that substantially satisfies the relationships C≧10*Cd wherein Cd is the parasitic capacitance of the diodes. Also preferably, all of the diodes are silicon carbide diodes.

The clamping circuit of this embodiment may form part of a transimpedance amplifier-based sensor. In such an arrangement, the transimpedance amplifier includes a feedback path connecting an input of the amplifier to an output of the amplifier. A sensor circuit is provided for supplying current to the input of the amplifier in response to a signal applied to the sensor circuit. Preferably, the sensor circuit comprises a silicon carbide photodiode or other high impedance photodiode connected to a transistor-based input stage. The pair of series-connected diodes of the clamping circuit are shunted across the feedback path of the amplifier.

Advantageously, it has been found that by incorporating the clamping circuit of the present invention in a transimpedance amplifier-based sensor, it is possible to ensure that sufficient current flow through the amplifier's feedback path exists to negate any expected value of photocurrent generated by the sensor circuit, without substantially deleteriously effecting the bandwidth and time constant of the sensor.

Also the silicon carbide diodes used in the sensor and clamping circuit of the present invention exhibit much better temperature vs. leakage current characteristics than conventional silicon diodes of similar construction (e.g., in some cases, more than several orders of magnitude better temperature vs. leakage current characteristics than silicon diodes). Advantageously, this permits the sensor and clamping circuit of the present invention to exhibit much better performance in high temperature environments than is possible according to the prior art.

These and other features and advantages of the present invention will become apparent as the following Detailed Description proceeds and upon reference to the Drawings, wherein like numerals depict like parts, and in which:

It will be appreciated by those skilled in the art that although the following Detailed Description will proceed with reference being made to preferred embodiments and methods of use, the present invention is not intended to be limited to these preferred embodiments and methods of use. Rather, the present invention is of broad scope and is intended to be limited only as set forth in the accompanying claims.

DETAILED DESCRIPTION OF PREFERRED EMBODIMENTS

Figure 2:
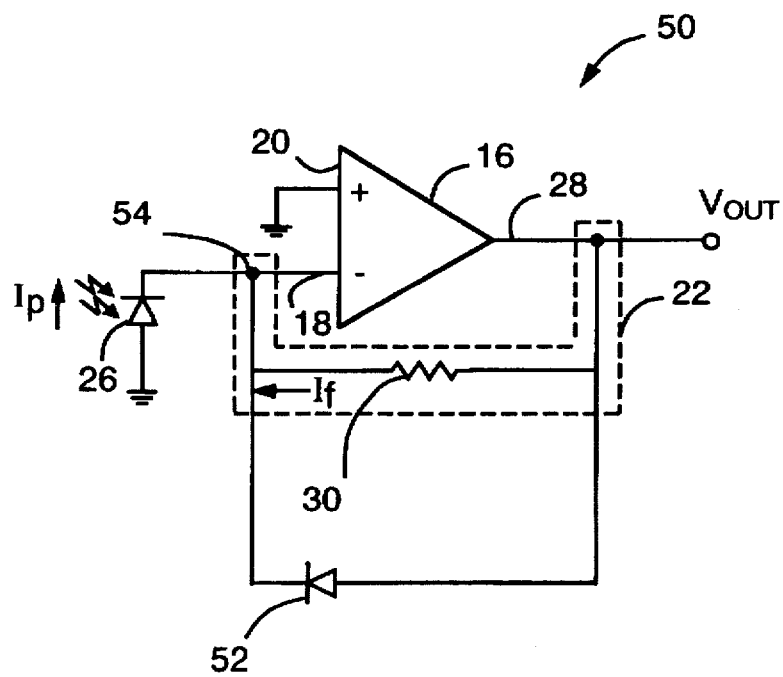
FIG. 2 is a schematic circuit diagram of another conventional transimpedance electromagnetic radiation sensor.
Figure 3:
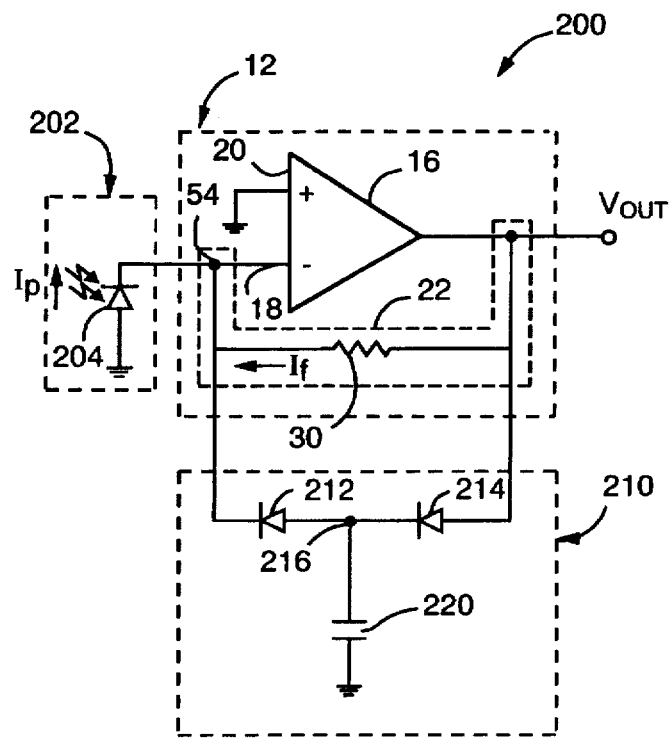
FIG. 3 is a schematic circuit diagram of one preferred embodiment of an electromagnetic radiation sensor with a clamping circuit according to present invention.

FIG. 3 is a schematic diagram of one preferred embodiment of an electromagnetic radiation sensor 200 with clamping circuit according to the present invention. Sensor 200 includes sensor circuit 202, clamping circuit 210, and conventional transimpedance amplifier 12 (which preferably is of the type described previously in connection with FIGS. 1–2). Sensor circuit 202 preferably comprises a conventional silicon carbide photodiode 204 for generating and supplying electrical photocurrent $I_p$ to the transimpedance amplifier 12 in response to incident electromagnetic radiation within the band to which the diode 204 is sensitive (e.g., the optical frequency band). Alternatively, photodiode 204 may be replaced with a photodiode constructed from silicon or other high impedance material configured to generate and supply the photocurrent to the amplifier 12 in response to incident electromagnetic radiation. Preferably, the anode of photodiode 204 is connected to ground and its cathode is connected to node 54 of amplifier 12.

In accordance with this embodiment 200 of the present invention, clamping circuit 210 comprises a pair of silicon carbide diodes 212, 214 which are connected in series, and are shunted across the resistor 30 of feedback path 22 of the transimpedance amplifier 12. Diodes 212, 214 are biased to conduct current in the same direction (indicated in FIG. 3) as the feedback current $I_f$ flowing through the feedback path 22. Diodes 212, 214 function in a manner substantially similar to clamping diode 52 of the conventional sensor 50 to ensure sufficient current flow to node 54 from output 28 to negate any expected magnitude of photocurrent $I_p$.

Clamping circuit 210 also includes a capacitive element (e.g., a ceramic capacitor) 220 which is connected to node 216, in-between the diodes 212 and 214, and to ground. Capacitor 220 acts as a low resistance shunt from node 216 to ground potential for high frequency signals passing through clamping circuit 210, and reduces the total effective parasitic capacitance of the parallel combination of the pair of diodes 212 and 214 and the feedback resistor 30. Preferably, diodes 212 and 214 are chosen so as to have substantially equal parasitic capacitances Cd, feedback path 22 is constructed so as to have as small a parasitic capacitance Cf as is practical, and capacitor 220 is chosen so as to have a capacitance C, such that C≧10*Cd. Advantageously, it has been found that by constructing sensor 200 in this manner, the total effective parasitic capacitance of the parallel combination of the diodes 212, 214 and the resistor 30 may be reduced to such an extent that the bandwidth and time constant of sensor 200 may approach those of the conventional unclamped sensor 10 shown in FIG. 1, without suffering from the aforesaid and other drawbacks of the conventional sensor 10 of FIG. 1.

Also the silicon carbide diodes 204, 212, and 214 used in sensor 200 exhibit much better temperature vs. leakage current characteristics than conventional silicon diodes of similar construction (e.g., in some cases, more than several orders of magnitude better temperature vs. leakage current characteristics than silicon diodes). Advantageously, this permits the sensor 200 to exhibit much better performance in high temperature environments than would be possible if the diodes 204, 212, and 214 were conventional silicon diodes.

Figure 4:
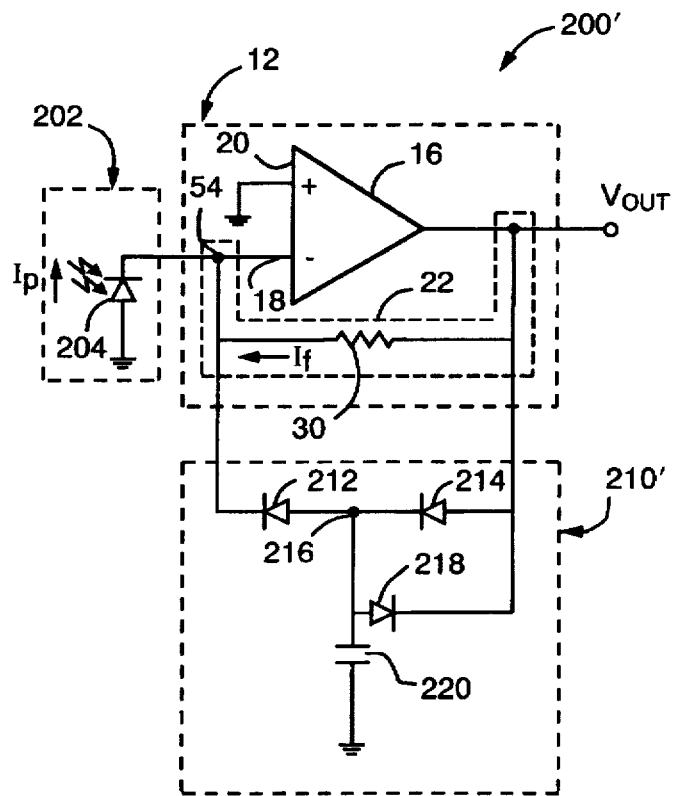
FIG. 4 is a schematic circuit diagram of another preferred embodiment of an electromagnetic radiation sensor with a clamping circuit according to the present invention.

FIG. 4 is a schematic circuit diagram of another preferred embodiment of a sensor with clamping circuit according to the present invention. Unless otherwise specifically stated to the contrary, it should be understood that sensor 200' of FIG. 4 comprises the same elements and operates in the same way as sensor 200 of FIG. 3. Sensor 200' includes clamping circuit 210' which comprises a third silicon carbide diode 218 shunted across one diode 214 of the pair of diodes 212, 214. Diode 218 is reversed biased compared to diode 214, so as to permit current flow through diode 218 in a direction opposite to that permitted by diodes 212 and 214. Preferably, diode 218 is substantially identical in construction to diodes 212 and 214, and also exhibits parasitic capacitance Cd. Diode 218 acts to clamp undesired undershoot generated when the magnitude of the photocurrent changes suddenly. Advantageously, this improves the settling time of the sensor 200'.

Figure 5:
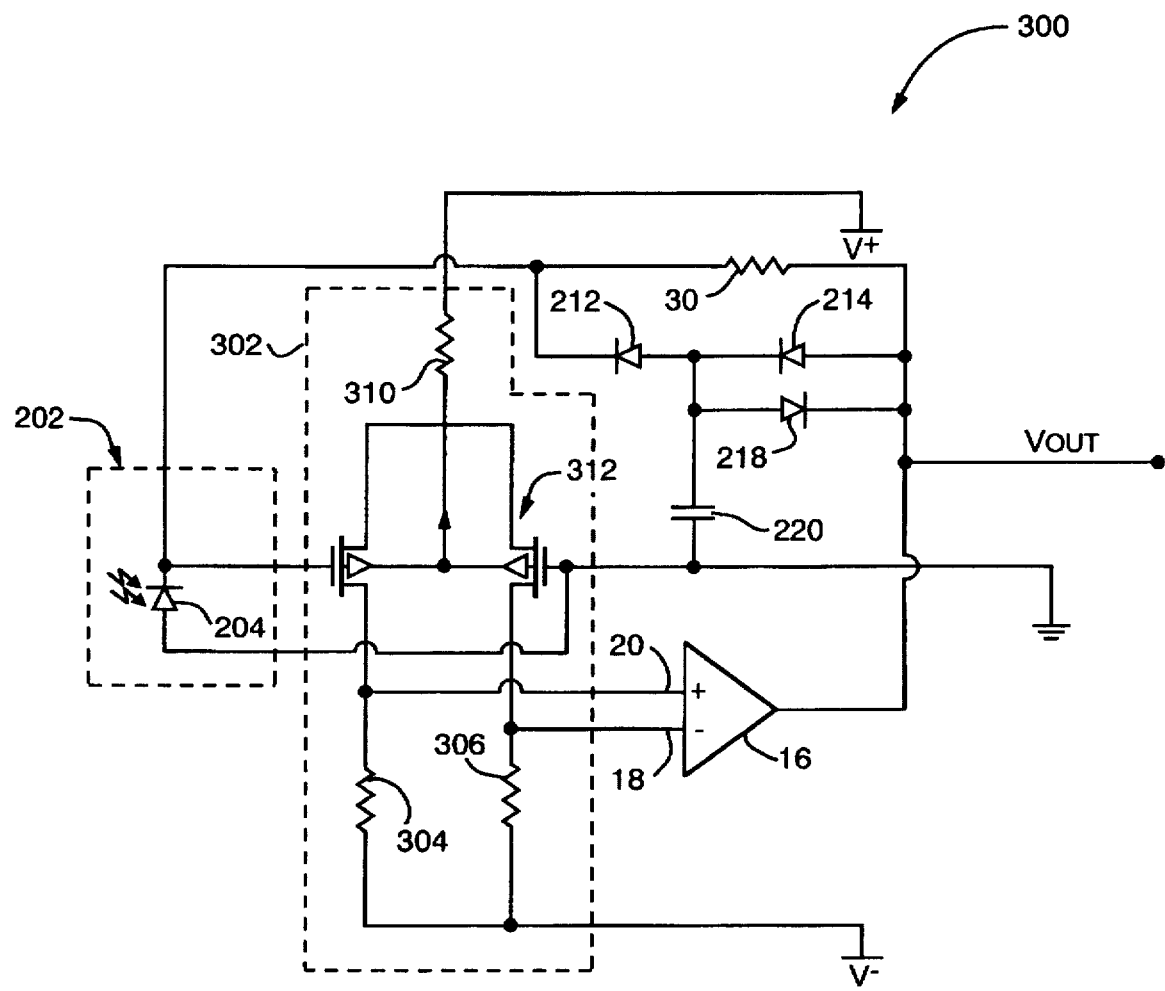
FIG. 5 is a schematic circuit diagram of yet another preferred embodiment of an electromagnetic radiation sensor with a clamping circuit according to the present invention.

FIG. 5 is a schematic circuit diagram of another preferred embodiment of the sensor with clamping circuit according to the present invention. Unless otherwise specifically stated to the contrary, it should be understood that sensor 300 of FIG. 5 comprises the same elements and operates in the same way as sensor 200' of FIG. 4. In addition to the elements of sensor 200', sensor 300 includes a MOSFET input stage 302 connecting sensor circuit 202 to operational amplifier 16. Input stage 302 comprises a differential amplifier formed from a dual P-channel MOSFET 312, one of whose gates is connected to the cathode of the photodiode 204 of the sensor circuit 202, and the other of whose gates is connected to ground potential. The sources and drains of the MOSFET 312 are connected via resistors 304, 306, and 310 to positive and negative power sources V+ and V-, respectively. Preferably, these resistors 304, 306, and 310 are chosen so as to bias transistor-based amplifier 312 to operate in its linear region. The inputs 18, 20 of the operational amplifier 16 are connected to the drain outputs of the transistor amplifier 312. Preferably, in this embodiment the resistor 30 has a resistance of $3 \times 10^9$ ohms and parasitic capacitance of 1 picofarad, capacitor 220 has a capacitance C of 0.01 microfarads, and diodes 212, 214, and 218 each have a parasitic capacitance Cd of 10 picofarads.

EXAMPLE

Figure 1:
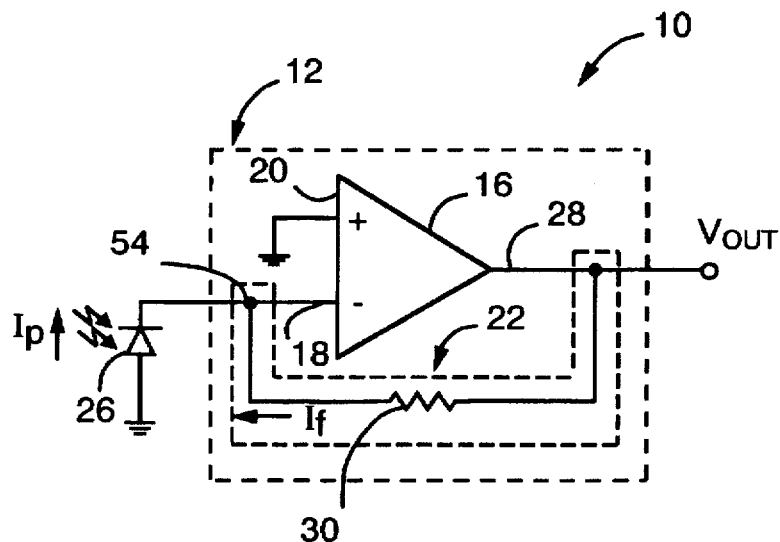
FIG. 1 is a schematic circuit diagram of a conventional transimpedance amplifier-based electromagnetic radiation sensor.
Figure 6:
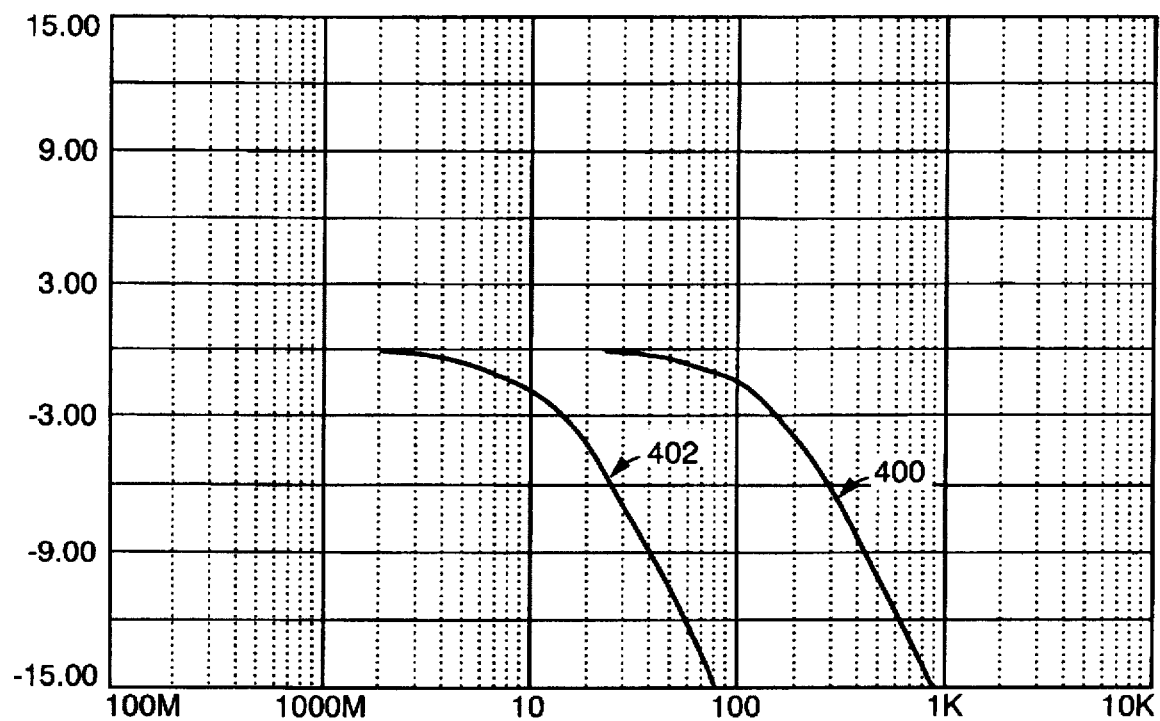
FIG. 6 is a graph illustrating the frequency response of the prior art sensors shown in FIGS. 1 and 2.

In order to demonstrate the unique advantages of the present invention, frequency responses of the conventional sensors 10, 50 illustrated in FIGS. 1 and 2 were simulated using a conventional circuit simulation computer program. In said simulations, the resistor 30 was given a resistance of $10^9$ ohms and a parasitic capacitance of 1 picofarad, and the diode 52 was given a parasitic capacitance of 10 picofarads. Plots of the simulated frequency responses of the sensors 10, 50 are shown in FIG. 6, and referred to as 400 and 402, respectively. As can be deduced from simulated frequency response curves 400 and 402, the bandwidths of sensors 10 and 50 are 160 Hz and 15 Hz, respectively. Also, the time constants of sensors 10 and 50 are 1 millisecond and 11 milliseconds, respectively.

Figure 7:
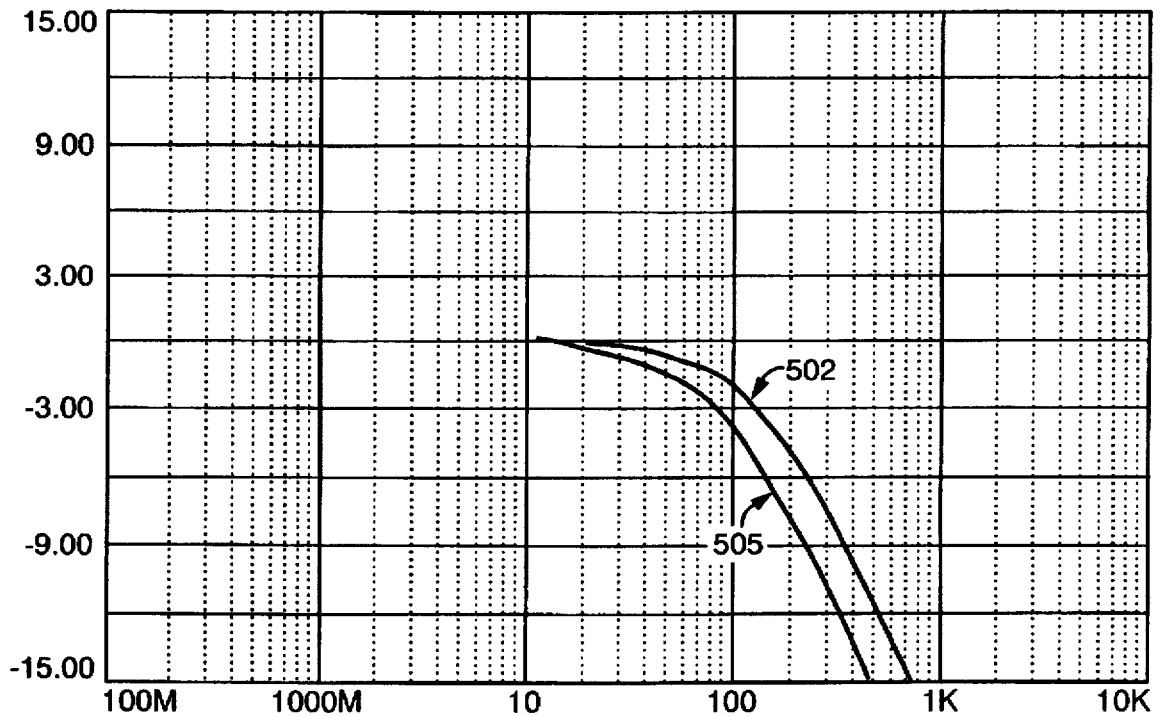
FIG. 7 is a graph illustrating the frequency response of the sensor shown in FIG. 4.

The frequency response of sensor 200' was simulated twice using the same conventional circuit simulation computer program used to simulate the frequency responses of conventional sensors 10 and 50. In said simulations, the resistor 30 was given a resistance of $10^9$ ohms and a parasitic capacitance of 1 picofarad, and diodes 212, 214, and 218 were each given a parasitic capacitance of 10 picofarads. In the first of the two simulations, the capacitor 220 was given a capacitance of 200 picofarads, while in the second simulation the capacitor was given a capacitance of 1000 picofarads. Plots of these two simulations are shown in FIG. 7, and referred to as 500 and 502, respectively. As can be deduced from simulated frequency response curves 500 and 502, sensor 200' exhibits bandwidths of 85 Hz and 140 Hz when the capacitor 220 has capacitances of 200 picofarads and 1000 picofarads, respectively. Additionally, sensor 200' exhibits time constants of 1.9 milliseconds and 1.1 milliseconds when the capacitor 220 has capacitances of 200 picofarads and 1000 picofarads, respectively.

Thus, it is evident that there has been provided in accordance with the present invention a clamping circuit that fully satisfies the aims and objectives hereinbefore set forth. It will be apparent to those skilled in the art that many modifications, alternatives, and variations of these preferred embodiments are possible without departing from the present invention. Therefore, the present invention is intended to be viewed quite broadly, as embracing all such modifications, alternatives, and variations, and as being limited only as set forth in the accompanying claims.

What is claimed is:

1. A circuit comprising, an operational amplifier having a non-inverting input coupled to ground potential, an inverting input for receiving an input signal, and an output; a resistor coupled between the inverting input and the output; a first diode whose cathode is coupled to the inverting input; a second diode whose cathode is coupled to an anode of the first diode, said second diode also having an anode coupled to the output; and a capacitor coupled between the anode of the first diode and said ground potential.

2. A clamping circuit according to claim 1, wherein at least one of the diodes comprises a silicon carbide diode.

3. A circuit according to claim 1, wherein said first and second diodes are shunted across said resistor.

4. A circuit according to claim 1, further comprising a third diode shunted across said second diode and reversed biased compared to said second diode.

5. A circuit according to claim 1, wherein said capacitor is also coupled to the cathode of said second diode.

6. A circuit according to claim 5, further comprising a third diode having a cathode coupled to said output, said third diode also having an anode coupled to said capacitor.

7. A circuit according to claim 1, wherein each of said diodes is a silicon carbide diode.

8. A circuit according to claim 1, wherein each of said diodes has a parasitic capacitance equal to Cd, and said capacitor has a capacitance that is equal to or greater than ten times Cd.

9. A circuit according to claim 8, further comprising a third diode shunted across said second diode and reversed biased compared to said second diode, said third diode also having a respective parasitic capacitance equal to Cd.

* * * * *